US012693708B2

(12) United States Patent
Kim et al.

(10) Patent No.: US 12,693,708 B2
(45) Date of Patent: Jul. 28, 2026

(54) DISPLAY DEVICE INCLUDING A FOLDABLE DISPLAY PANEL AND A WINDOW OF WHICH A PORTION OVERLAPS A FOLDING AREA OF THE FOLDABLE DISPLAY PANEL AND ELECTRONIC DEVICE INCLUDING THE SAME

(71) Applicant: Samsung Display Co., Ltd., Yongin-si (KR)

(72) Inventors: In-Bae Kim, Daejeon (KR); Jinseock Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 18/660,559

(22) Filed: May 10, 2024

(65) Prior Publication Data

US 2024/0295904 A1 Sep. 5, 2024

Related U.S. Application Data

(62) Division of application No. 17/536,544, filed on Nov. 29, 2021, now Pat. No. 12,001,243.

(30) Foreign Application Priority Data

Mar. 30, 2021 (KR) ........................ 10-2021-0041179

(51) Int. Cl.
*G06F 1/16* (2006.01)
*C09K 3/14* (2006.01)
(Continued)

(52) U.S. Cl.
CPC .......... *G06F 1/1641* (2013.01); *C09K 3/1481* (2013.01); *G06F 1/1616* (2013.01);
(Continued)

(58) Field of Classification Search
CPC .... G06F 1/1641; G06F 1/1616; G06F 1/1652; C09K 3/1481; G09F 9/301;
(Continued)

(56) References Cited

U.S. PATENT DOCUMENTS 9,189,027 B2 11/2015 Lee et al.
10,303,218 B2 * 5/2019 Jones ..................... H05K 1/028
(Continued)

FOREIGN PATENT DOCUMENTS

CN 104424851 A 3/2015
CN 108975718 12/2018
(Continued)

*Primary Examiner* — Rockshana D Chowdhury
(74) *Attorney, Agent, or Firm* — Sughrue Mion, PLLC

(57) ABSTRACT

A display device includes a display panel configured to display an image, the display panel including a first non-folding area; a second non-folding area; and a folding area disposed between the first non-folding area and the second non-folding area; and a window disposed on the display panel and including a folding portion overlapping the folding area of the display panel. The folding portion of the window includes a first substantially curved surface, a substantially flat surface extending from the first substantially curved surface; and a second substantially curved surface extending from the substantially flat surface.

10 Claims, 14 Drawing Sheets

(51) Int. Cl.

| | |
|---|---|
| *G09F 9/30* | (2006.01) |
| *H10K 50/84* | (2023.01) |
| *H10K 59/00* | (2023.01) |
| *H10K 71/00* | (2023.01) |
| *H10K 77/10* | (2023.01) |
| *H10P 50/00* | (2026.01) |
| *H10P 50/64* | (2026.01) |
| *H10P 90/00* | (2026.01) |
| *H10W 70/67* | (2026.01) |
| *H10K 102/00* | (2023.01) |

(52) U.S. Cl.
CPC ............ *G06F 1/1652* (2013.01); *G09F 9/301* (2013.01); *H10K 50/84* (2023.02); *H10K 59/00* (2023.02); *H10K 71/00* (2023.02); *H10K 77/111* (2023.02); *H10P 50/00* (2026.01); *H10P 50/642* (2026.01); *H10P 90/126* (2026.01); *H10W 70/688* (2026.01); *H10K 2102/311* (2023.02)

(58) Field of Classification Search
CPC ............. H01L 21/02019; H01L 21/302; H01L 21/30604; H01L 23/4985; H10K 50/84; H10K 59/00; H10K 71/00; H10K 77/111; H10K 2102/311
See application file for complete search history.

(56) References Cited

U.S. PATENT DOCUMENTS

| | | | | |
|---|---|---|---|---|
| 10,545,537 | B2 * | 1/2020 | Ahn | B32B 27/06 |
| 10,620,465 | B2 | 4/2020 | Lee et al. | |
| 10,722,995 | B2 * | 7/2020 | Park | B24B 7/10 |
| 11,322,054 | B2 * | 5/2022 | Park | G09F 9/301 |
| 11,360,517 | B2 * | 6/2022 | Paek | G06F 1/1652 |
| 11,610,520 | B2 * | 3/2023 | Park | G06F 1/1641 |
| 11,721,244 | B2 * | 8/2023 | Chun | B32B 27/308 |
| | | | | 361/679.01 |
| 11,740,661 | B2 * | 8/2023 | Namkung | H05K 1/028 |
| | | | | 361/749 |
| 11,758,752 | B2 * | 9/2023 | Hyun | H10K 59/871 |
| | | | | 257/88 |
| 11,839,137 | B2 * | 12/2023 | Yee | B32B 27/065 |
| 11,856,714 | B2 * | 12/2023 | Min | B32B 27/08 |
| 11,947,395 | B2 * | 4/2024 | Wu | B32B 7/12 |
| 12,041,738 | B2 * | 7/2024 | Nguyen | H04M 1/0268 |
| 12,092,854 | B2 * | 9/2024 | Nakazawa | G02B 6/0046 |
| 12,437,689 | B2 * | 10/2025 | Roh | G06F 1/1652 |
| 2010/0068889 | A1 | 3/2010 | Stockum et al. | |
| 2015/0146386 | A1 * | 5/2015 | Namkung | H05K 1/028 |
| | | | | 361/749 |
| 2015/0357387 | A1 | 12/2015 | Lee et al. | |
| 2017/0040406 | A1 * | 2/2017 | Park | H10K 59/131 |
| 2017/0045914 | A1 * | 2/2017 | Namkung | H05K 1/028 |
| 2017/0064845 | A1 * | 3/2017 | Jung | G02F 1/133305 |
| 2019/0204872 | A1 * | 7/2019 | Lee | G06F 1/1641 |
| 2020/0133345 | A1 * | 4/2020 | Ahn | B32B 3/30 |
| 2021/0072797 | A1 | 3/2021 | He et al. | |
| 2021/0107826 | A1 * | 4/2021 | Hwang | C03C 17/3405 |
| 2022/0263043 | A1 * | 8/2022 | Sunwoo | H10K 59/12 |
| 2022/0291712 | A1 | 9/2022 | Baby et al. | |
| 2022/0317731 | A1 * | 10/2022 | Kim | G06F 1/1616 |
| 2022/0376201 | A1 * | 11/2022 | Kim | H10K 77/111 |
| 2024/0188413 | A1 * | 6/2024 | Park | G09F 9/301 |
| 2024/0198456 | A1 * | 6/2024 | Kwon | G06F 1/1681 |
| 2024/0295904 | A1 * | 9/2024 | Kim | G06F 1/1616 |

FOREIGN PATENT DOCUMENTS

| | | |
|---|---|---|
| CN | 110872685 A | 3/2020 |
| CN | 112456766 A | 3/2021 |
| KR | 10-2013-0139664 | 12/2013 |
| KR | 10-1473502 | 12/2014 |
| KR | 10-2017-0122554 | 11/2017 |
| KR | 10-2018-0132201 | 12/2018 |
| KR | 10-2019-0032686 | 3/2019 |
| KR | 10-2111138 | 5/2020 |
| KR | 10-2203104 | 1/2021 |
| WO | 2021/041882 | 3/2021 |

* cited by examiner

SUB

TK-S

SUB-1

TK1

EP          SUB-1

TK1

UNFA2          UFA          UNFA1

DISPLAY DEVICE INCLUDING A FOLDABLE DISPLAY PANEL AND A WINDOW OF WHICH A PORTION OVERLAPS A FOLDING AREA OF THE FOLDABLE DISPLAY PANEL AND ELECTRONIC DEVICE INCLUDING THE SAME

CROSS-REFERENCE TO RELATED APPLICATION(S)

This is a divisional application of U.S. patent application Ser. No. 17/536,544 filed Nov. 29, 2021 (now pending), the disclosure of which is incorporated herein by reference in its entirety. U.S. patent application Ser. No. 17/536,544 claims priority to and benefits of Korean Patent Application No. 10-2021-0041179 under 35 U.S.C. § 119, filed on Mar. 30, 2021 in the Korean Intellectual Property Office, the entire contents of which are incorporated herein by reference.

BACKGROUND

1. Technical Field

The disclosure herein relates to a foldable display device including a window, a method of manufacturing a window, and a method of manufacturing a display device using the same.

2. Description of the Related Art

An electronic device displays various images on a display screen and provides information to a user. In general, the electronic device displays information within an assigned screen. In recent years, flexible electronic devices including a foldable flexible display panel have been developed. The flexible electronic device may be folded, rolled, and bent unlike a rigid electronic device. Since the flexible display device, which is variously changeable in shape, may be carried out regardless of a typical screen size, user convenience may improve.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device with improved product reliability, a method of manufacturing a window thereof, and a method of manufacturing a display device using the same.

An embodiment provides a display device that may include a display panel configured to display an image, the display panel including a first non-folding area; a second non-folding area; and a folding area disposed between the first non-folding area and the second non-folding area; and a window disposed on the display panel and including a folding portion overlapping the folding area of the display panel, and the folding portion of the window may include a first substantially curved surface, a substantially flat surface extending from the first substantially curved surface, and a second substantially curved surface extending from the substantially flat surface.

In an embodiment, each of the folding area of the display panel and the folding portion of the window may be folded and unfolded with respect to a folding axis extending in a first direction, the first substantially curved surface, the substantially flat surface, and the second substantially curved surface may be in sequence in a second direction intersecting the first direction, and each of a first width of the first substantially curved surface, parallel to the second direction, and a second width of the second substantially curved surface, parallel to the second direction, may be greater than a third width of the substantially flat surface, parallel to the second direction.

In an embodiment, each of the first width of the first substantially curved surface and the second width of the second substantially curved surface may be about two times or more of the third width of the substantially flat surface, each of the first width of the first substantially curved surface and the second width of the second substantially curved surface may be about 26 mm, and the third width of the substantially flat surface may be about 8 mm.

In an embodiment, the window may further include a first non-folding portion overlapping the first non-folding area; and a second non-folding portion overlapping the second non-folding area, and each of a thickness of the first non-folding portion and a thickness of the second non-folding portion may be greater than a minimum thickness of the folding portion of the window.

In an embodiment, the window may include a top surface and a bottom surface facing the top surface, the bottom surface of the window may be disposed between the top surface of the window and the display panel, and the top surface may include the first substantially curved surface, the substantially flat surface, and the second substantially curved surface.

In an embodiment, the display device may further include a protection film disposed on the window; and an adhesive layer disposed between the protection film and the window, and the adhesive layer may be disposed on the first substantially curved surface, the substantially flat surface, and the second substantially curved surface.

In an embodiment, the window may be a glass substrate.

In an embodiment, a method of manufacturing a window may include providing a source substrate; forming a first preliminary substrate by etching the source substrate; and forming a second preliminary substrate by etching a portion of the first preliminary substrate, and the forming of the second preliminary substrate may include forming an etching paste on the portion of the first preliminary substrate; radiating heat having a temperature gradient to the etching paste by using a lamp; and forming a first substantially curved surface, a substantially flat surface extending from the first substantially curved surface, and a second substantially curved surface extending from the substantially flat surface by etching the portion of the first preliminary substrate.

In an embodiment, a part of the first preliminary substrate, to which heat is radiated by the lamp, may have a surface area greater than a surface area of the portion of the first preliminary substrate on which the etching paste is formed.

In an embodiment, the lamp may include at least one first lamp; at least one second lamp; and at least one third lamp, the at least one second lamp may have a temperature greater than a temperature of each of the at least one first lamp and the at least one third lamp, the first substantially curved surface may be formed by the at least one first lamp, the substantially flat surface may be formed by the at least one second lamp, and the second substantially curved surface may be formed by the at least one third lamp.

In an embodiment, the at least one first lamp may include a plurality of first lamps, the at least one third lamp may include a plurality of third lamps, and each of the plurality of first lamps and the plurality of third lamps may have a temperature gradient that gradually decreases in a direction away from the at least one second lamp. In an embodiment, the at least one second lamp may include a plurality of second lamps, and the plurality of second lamps may each have a same temperature.

In an embodiment, the forming of the etching paste may include screen-printing the etching paste on the portion of the first preliminary substrate.

In an embodiment, a method of manufacturing a display device may include forming a display panel which may include a first non-folding area, a second non-folding area, and a folding area disposed between the first non-folding area and the second non-folding area; forming a window which may include a folding portion including a first substantially curved surface, a substantially flat surface extending from the first substantially curved surface, and a second substantially curved surface extending from the substantially flat surface; and disposing the window on the display panel such that the folding portion of the window overlaps the folding area of the display panel.

In an embodiment, the forming of the window may include providing a source substrate; forming a first preliminary substrate by etching the source substrate; and forming a second preliminary substrate by etching the portion of the first preliminary substrate, and the forming of the second preliminary substrate may include forming an etching paste on a portion of the first preliminary substrate; radiating heat to the etching paste by using a lamp; and forming the first substantially curved surface, the substantially flat surface, and the second substantially curved surface by etching the portion of the first preliminary substrate.

In an embodiment, a part of the first preliminary substrate, to which heat is radiated by the lamp, may have a surface area greater than a surface area of the portion of the first preliminary substrate, on which the etching paste is formed.

In an embodiment, the lamp may include at least one first lamp, at least one second lamp, and at least one third lamp, the at least one second lamp may have a temperature greater than a temperature of each of the at least one first lamp and the at least one third lamp, the first substantially curved surface may be formed by the at least one first lamp, the substantially flat surface may be formed by the at least one second lamp, and the second substantially curved surface may be formed by the at least one third lamp.

In an embodiment, the at least one first lamp may include a plurality of first lamps, and the at least one third lamp may include a plurality of third lamps, and each of the plurality of first lamps and the plurality of third lamps may have a temperature gradient that gradually decreases in a direction away from the at least one second lamp.

In an embodiment, each of the folding area of the display panel and the folding portion of the window may be folded and unfolded with respect to a folding axis extending in a first direction, the first substantially curved surface, the substantially flat surface, and the second substantially curved surface may be in sequence in a second direction intersecting the first direction, and each of a first width of the first substantially curved surface, parallel to the second direction, and a second width of the second substantially curved surface, parallel to the second direction, may be greater than a third width of the substantially flat surface, parallel to the second direction.

In an embodiment, the window may include a top surface and a bottom surface facing the top surface, the top surface of the window may include the first substantially curved surface, the substantially flat surface, and the second substantially curved surface, and the disposing of the window on the display panel may include aligning the bottom surface of the window between the top surface of the window and the display panel; and disposing the bottom surface of the window on the display panel.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings:

FIG. 5A is a schematic cross-sectional view of the display device according to an embodiment;

FIG. 5B is a schematic cross-sectional view of the display device according to an embodiment;

DETAILED DESCRIPTION OF THE EMBODIMENTS

Figure 1A:
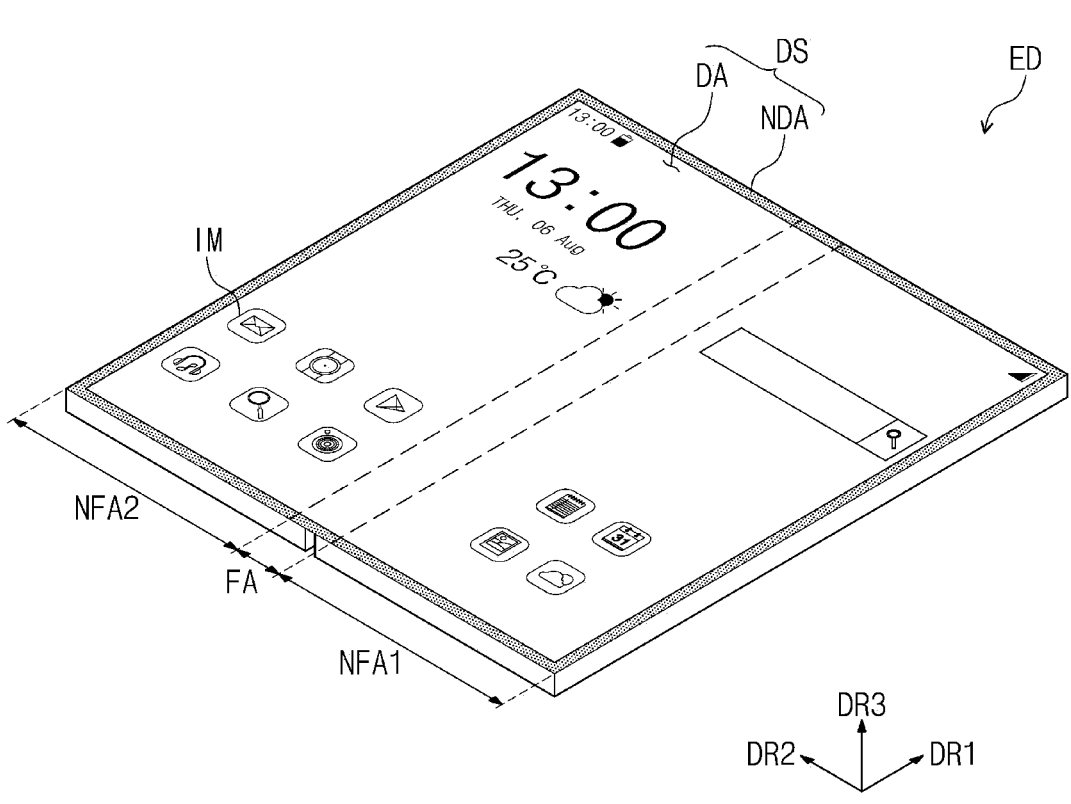
FIGS. 1A and 1B are schematic perspective views of an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will also be understood that when one component (or region, layer, portion) is referred to as being 'on', 'connected to', or 'coupled to' another component, it can be directly disposed/connected/coupled on/to the one component, or an intervening third component or other components may also be present.

It will be understood that the terms "connected to" or "coupled to" may include a physical or electrical connection or coupling.

Like reference numerals refer to like elements throughout. Also, in the figures, the thickness, ratio, and dimensions of components may be exaggerated for clarity of illustration.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the disclosure and the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings but are not limited thereto.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined otherwise in the description, the terms are not ideally or excessively construed as having a formal meaning.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments will be described with reference to the accompanying drawings.

Figure 1B:
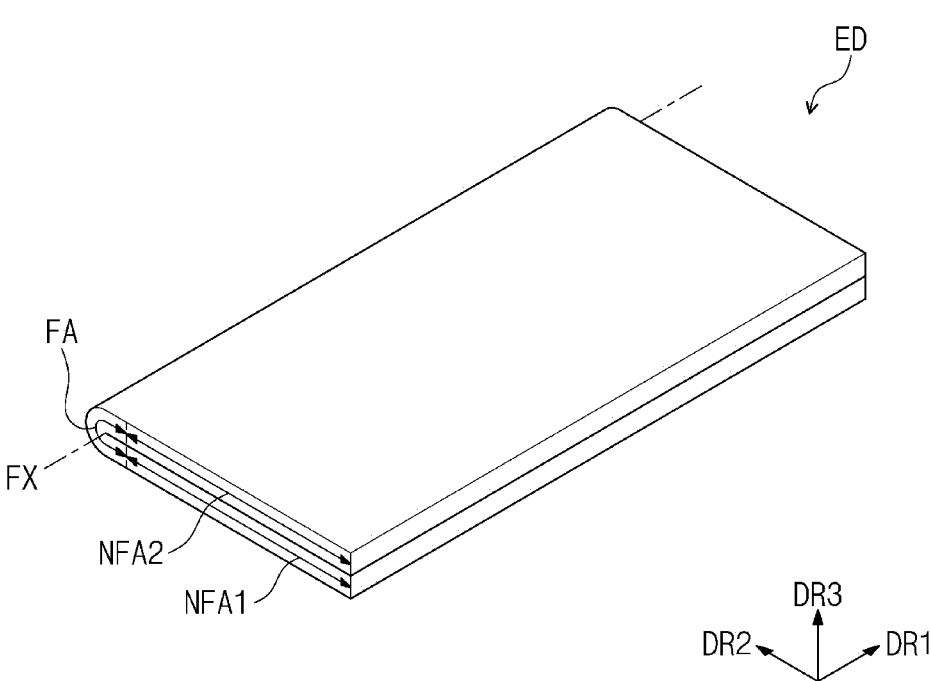

FIGS. 1A and 1B are schematic perspective views of an electronic device ED according to an embodiment. FIG. 1A illustrates an unfolded state (or an unfolding state) of the electronic device ED, and FIG. 1B illustrates a folded state of the electronic device ED.

Referring to FIGS. 1A and 1B, the electronic device ED according to an embodiment may include a display surface DS defined by a first direction DR1 and a second direction DR2 crossing or intersecting the first direction DR1. The electronic device ED may provide an image IM to a user through the display surface DS.

The display surface DS may include a display area DA and a non-display area NDA around the display area DA. The display area DA may display the image IM, and the non-display area NDA may not display the image IM. The non-display area NDA may surround or may be adjacent to the display area DA. However, an embodiment is not limited thereto. For example, shapes of the display area DA and the non-display area NDA may be deformed.

Hereinafter, a direction that crosses or intersects a plane defined by the first and second directions DR1 and DR2 in a substantially perpendicular manner may be defined as a third direction DR3. In this specification, an expression "in a plan view" may be defined as a state when viewed in the third direction DR3.

The electronic device ED may include a folding area FA and non-folding areas NFA1 and NFA2. The non-folding areas NFA1 and NFA2 may include a first non-folding area NFA1 and a second non-folding area NFA2. In the second direction DR2, the folding area FA may be disposed between the first non-folding area NFA1 and the second non-folding area NFA2. The folding area FA may be referred to as a foldable area FA, and the first and second non-folding areas NFA1 and NFA2 may be referred to as a first and second non-foldable areas NFA1 and NFA2.

As illustrated in FIG. 1B, the folding area FA may be folded with respect to a folding axis FX parallel to the first direction DR1. The folding area FA has a curvature and a radius of curvature. The first non-folding area NFA1 and the second non-folding area NFA2 may face each other, and the electronic device ED may be inner-folded so that the display surface DS is not exposed to the outside.

In an embodiment, the electronic device ED may be outer-folded so that the display surface DS is exposed to the outside. In an embodiment, the electronic device ED may perform an inner-folding or outer-folding operation from an unfolding operation in a repeated manner. However, an embodiment is not limited thereto. In an embodiment, the electronic device ED may select one of the unfolding operation, the inner-folding operation, and the outer-folding operation.

Figure 2:
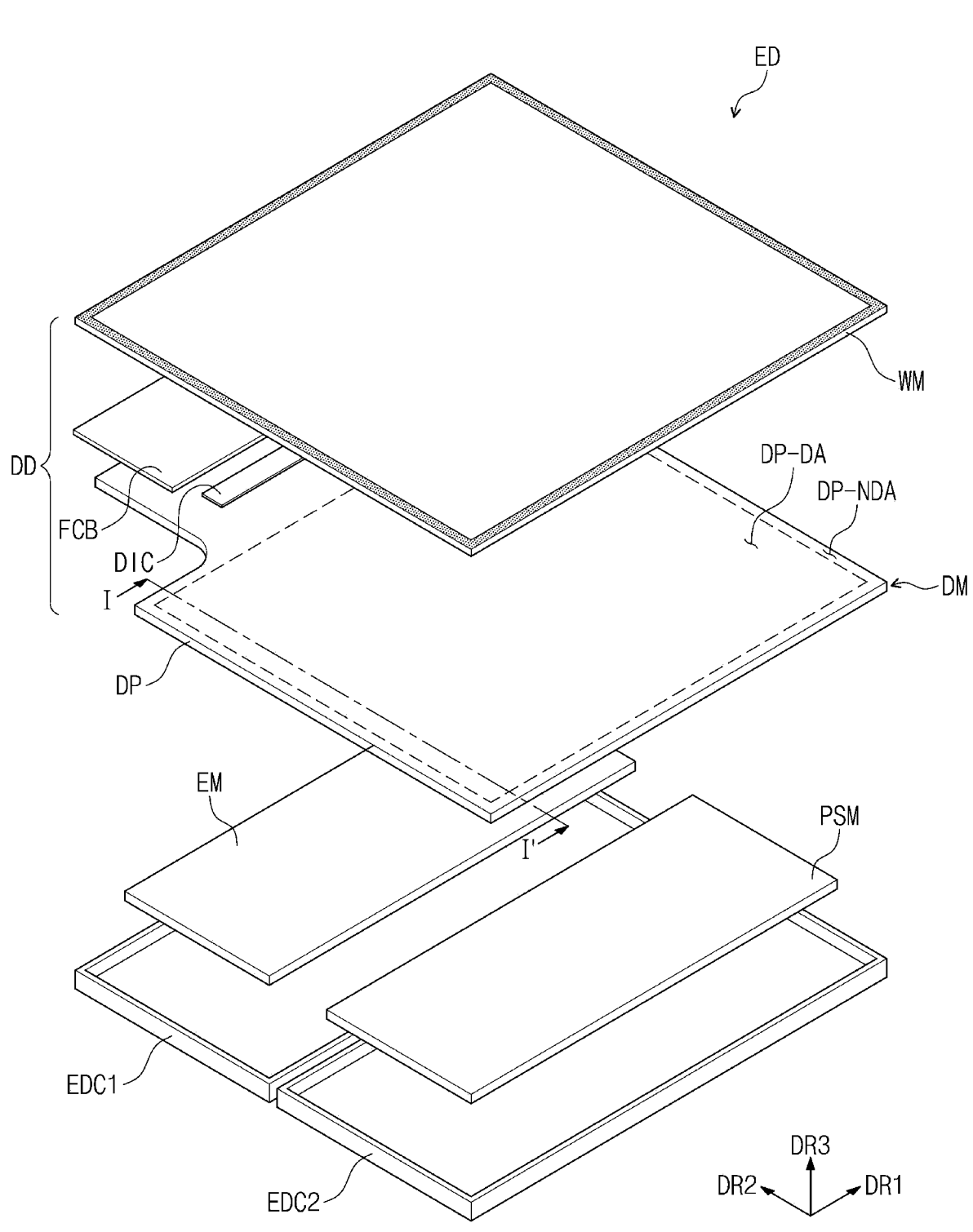
FIG. 2 is an exploded perspective view of the electronic device according to an embodiment.

FIG. 2 is an exploded perspective view of the electronic device according to an embodiment.

Referring to FIG. 2, the electronic device ED may include a display device DD, an electronic module EM, a power module PSM, and cases EDC1 and EDC2. Although not separately shown, the electronic device ED may further include a mechanism structure for controlling a folding operation of the display device DD.

The display device DD generates an image and senses an external input. The display device DD may include a window module WM and a display module DM. The window module WM provides a front surface of the electronic device ED.

The display module DM may include at least a display panel DP. Although the display module DM is the same as the display panel DP in FIG. 2, the display module DM may be substantially a laminated structure in which components may be laminated. A detailed description on a laminated structure of the display module DM will be described later.

The display panel DP may include a display area DP-DA and a non-display area DP-NDA, which correspond to the display area DA (refer to FIG. 1A) and the non-display area NDA (refer to FIG. 1A), respectively. In this specification, an expression "an area or portion corresponds to another area or portion" represents that the area or portion overlaps another area or portion, which is not limited to the same surface area. The display module DM may include a driving chip DIC disposed on the non-display area DP-NDA. The display module DM may include a flexible circuit film FCB coupled or connected to the non-display area DP-NDA.

The driving chip DIC may include driving elements for driving a pixel of the display panel DP, for example, a data driving circuit. Although a structure in which the driving chip DIC is mounted on the display panel DP is illustrated in FIG. 2, an embodiment is not limited thereto. For example, the driving chip DIC may be mounted on the flexible circuit film FCB.

The electronic module EM may include at least a main controller. The electronic module EM may include a wireless communication module, a camera module, a proximity sensor module, an image input module, a sound input module, a sound output module, a memory, and an external interface module. The electronic module EM may be electrically connected to the power module PSM.

The main controller controls an overall operation of the electronic device ED. For example, the main controller activates or deactivates the display device DD in accordance with an input of a user. The main controller may control operations of display device DD and other modules. The main controller may include at least one microprocessor.

The cases EDC1 and EDC2 accommodate the display module DM, the electronic module EM, and the power module PSM. Although two separated cases EDC1 and EDC2 are illustrated as an example, an embodiment is not limited thereto. Although not shown, the electronic device ED may further include a hinge structure for connecting the two cases EDC1 and EDC2. The cases EDC1 and EDC2 may be coupled or connected with the window module WM. The cases EDC1 and EDC2 protect components such as the display module DM, the electronic module EM, and the power module PSM, which are accommodated therein.

Figure 3:
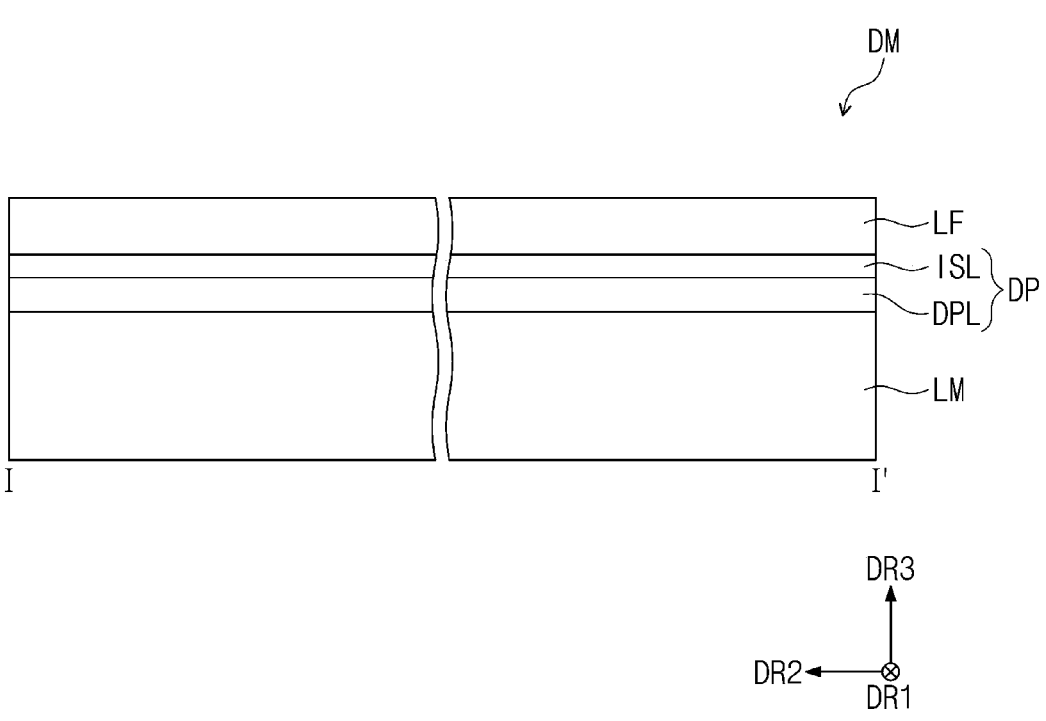
FIG. 3 is a schematic cross-sectional view of a display module according to an embodiment.

FIG. 3 is a schematic cross-sectional view of the display module according to an embodiment.

Referring to FIG. 3, the display module DM may include a display panel DP, an optical film LF disposed on the display panel DP, and a lower member LM disposed below the display panel DP. The display panel DP may include a display layer DPL and a sensor layer ISL disposed on the display layer DPL. An adhesive layer may be disposed between the above-described members as necessary.

The display layer DPL may be a component that substantially generates an image. The display layer DPL may be a light emitting display layer. For example, the display layer DPL may be an organic light emitting display layer, a quantum dot display layer, a micro-LED display layer, or a nano-LED display layer.

The sensor layer ISL may be disposed on the display layer DPL. The sensor layer ISU may sense an external input applied from the outside. The sensor layer ISL may be an external sensor attached to the display layer DPL or an integrated sensor consecutively manufactured during a manufacturing process of the display layer DPL.

The optical film LF may reduce a reflectance of light incident from the outside. The optical film LF may include a retarder and/or a polarizer. The optical film LF may include at least a polarizing film.

As an example, the optical film LF may include color filters. The color filters may have an arrangement. The arrangement of the color filters may be determined in consideration of emitted colors of the pixels PX provided in the display layer DPL. Also, the optical film LF may further include a black matrix adjacent to the color filters.

As an example, the optical film LF may include a destructive interference structure. For example, the destructive interference structure may include a first reflection layer and a second reflection layer, which are disposed on different layers from each other. First reflected light and second reflected light, which are reflected from the first reflection layer and the second reflection layer, respectively, may be destructively interfered with each other, and thus a reflectance of external light may decrease.

The lower member LM may include various functional members. The lower member LM may include a light shielding layer for blocking incident light, an impact absorbing layer for absorbing external impact, a support layer for supporting the display layer DPL, a heat dissipation layer for dissipating heat generated from the display layer DPL, and a digitizer for sensing an input of a pen (for example, an electronic pen). A detailed description on a laminated structure of the lower member LM will be described later.

Figure 4:
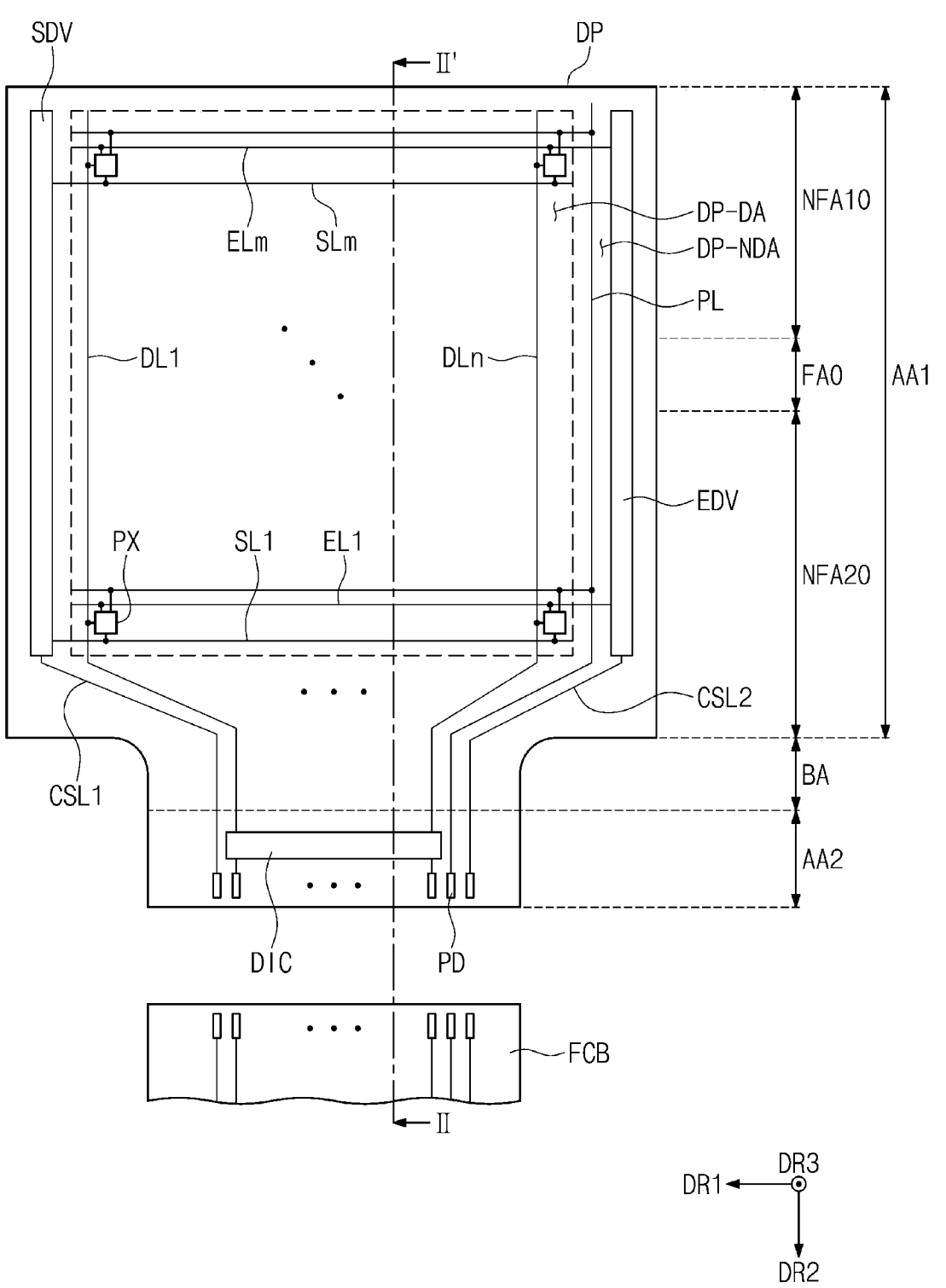
FIG. 4 is a plan view of a display panel according to an embodiment.

FIG. 4 is a plan view of the display panel according to an embodiment.

Referring to FIG. 4, the display area DP-DA and the non-display area DP-NDA around the display area DP-DA may be defined on the display panel DP. The display area DP-DA and the non-display area DP-NDA may be distinguished by whether the pixel PX is disposed thereon. The pixel PX is disposed on the display area DP-DA. A scan driving part SDV, a data driving part, and an emission driving part EDV may be disposed on the non-display area DP-NDA. The data driving part may be a partial circuit constituted in the driving chip DIC.

The display panel DP may include a first panel area AA1, a bending area BA, and a second panel area AA2, which are defined in the second direction DR2. Each of the bending area BA and the second panel area AA2 may be a partial area of the non-display area DP-NDA. The bending area BA may be disposed between the first panel area AA1 and the second panel area AA2.

The first panel area AA1 corresponds to the display surface DS in FIG. 1A. The first panel area AA1 may include a first non-folding area NFA10, a second non-folding area NFA20, and a folding area FA0. The first non-folding area NFA10, the second non-folding area NFA20, and the folding area FA0 correspond to the first non-folding area NFA1, the second non-folding area NFA2, and the folding area FA in FIGS. 1A and 1B, respectively.

In the first direction DR1, each of the bending area BA and the second panel area AA2 may have a width (or length) less than that of the first panel area AA1. An area having a short length in a bending axis direction may be further easily bent.

The display panel DP may include pixels PX, scan lines SL1 to SLm, data lines DL1 to DLn, emission lines EL1 to ELm, first and second control lines CSL1 and CSL2, a power line PL, and pads PD. Here, m and n are natural numbers. The pixels PX may be connected to the scan lines SL1 to SLm, the data lines DL1 to DLn, and the emission lines EL1 to ELm.

The scan lines SL1 to SLm may each extend in the first direction DR1 and be electrically connected to the scan driving part SDV. The data lines DL1 to DLn may each extend in the second direction DR2 and be electrically connected to the driving chip DIC through the bending area BA. The emission lines EL1 to ELm may each extend in the first direction DR1 and be electrically connected to the emission driving part EDV.

The power line PL may include a portion extending in the first direction DR1 and a portion extending in the second direction DR2. The portion extending in the first direction DR1 and the portion extending in the second direction DR2 may be disposed on different layers from each other. The portion extending in the second direction DR2 in the power line PL may extend to the second panel area AA2 through the bending area BA. The power line PL may provide a first voltage to the pixels PX.

The first control line CSL1 may be connected to the scan driving part SDV and extend toward a lower end of the second panel area AA2 through the bending area BA. The second control line CSL2 may be connected to the emission driving part EDV and extend toward the lower end of the second panel area AA2 through the bending area BA.

In a plan view, the pads PD may be disposed adjacent to the lower end of the second panel area AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

Figure 5A:
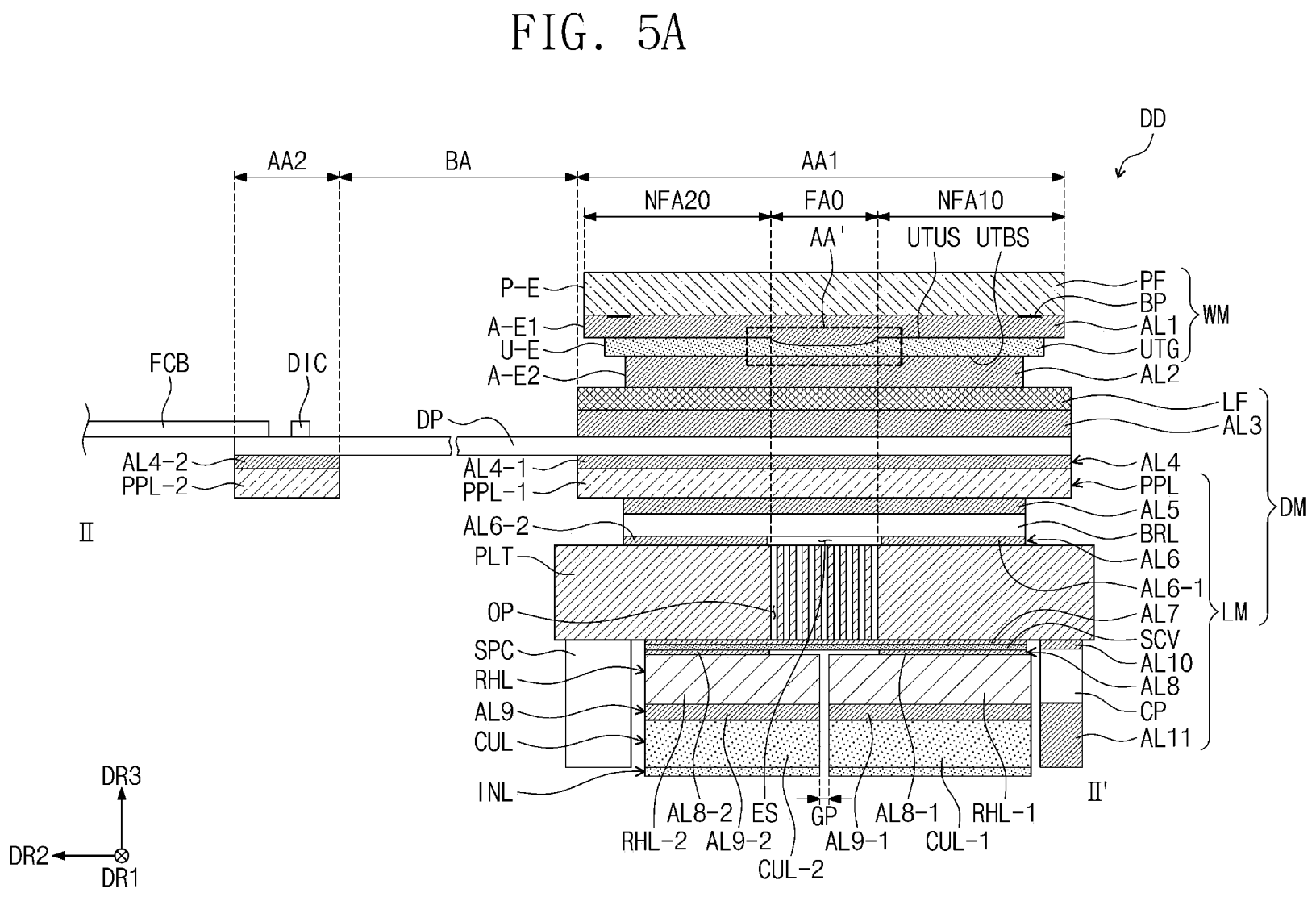
Figure 5B:
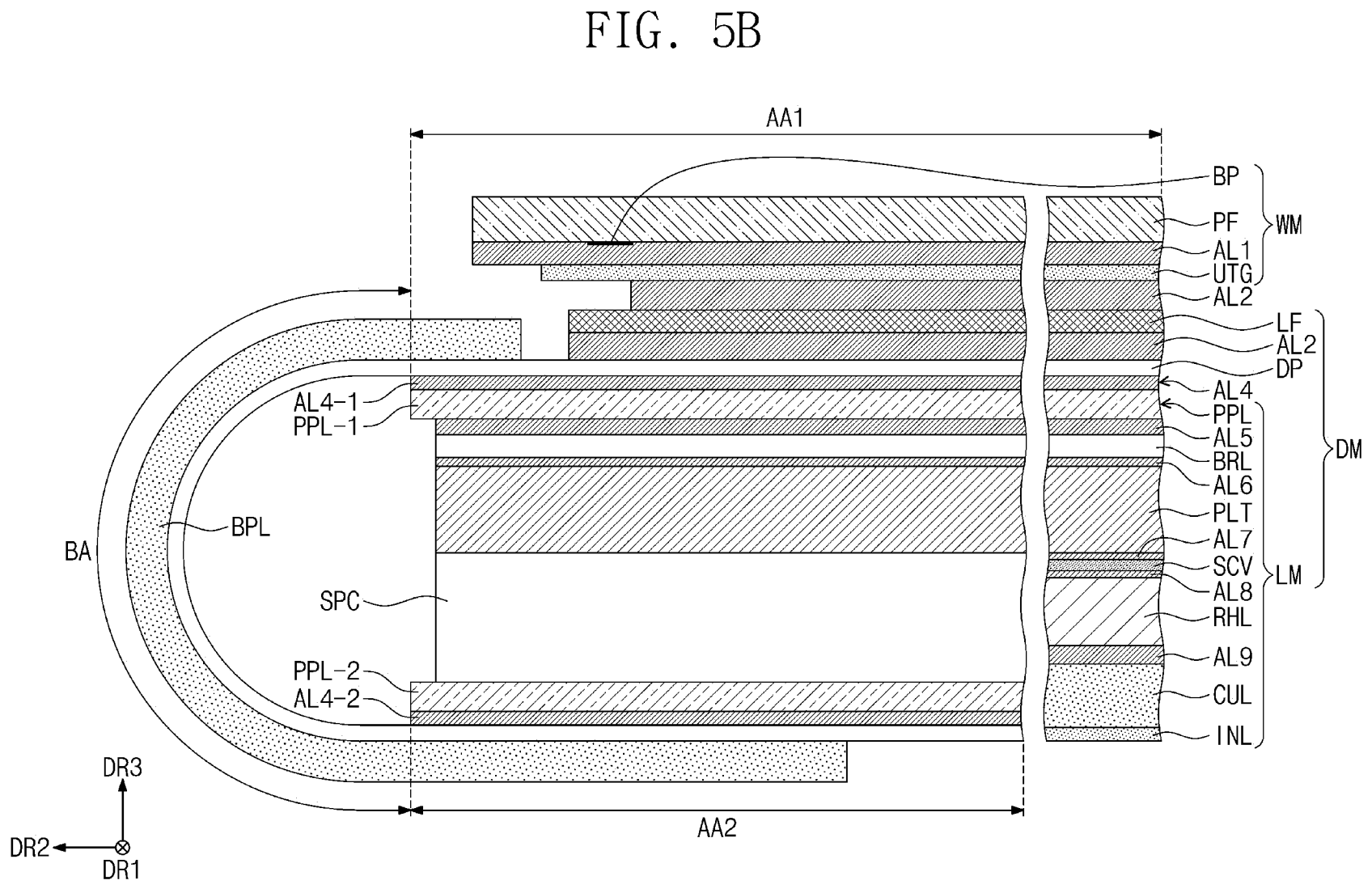

FIG. 5A is a schematic cross-sectional view of the display device according to an embodiment. FIG. 5B is a schematic cross-sectional view of the display device according to an embodiment.

FIG. 5A illustrates a state before the display device DD is installed in the electronic device ED (refer to FIG. 1A), and FIG. 5B illustrates a state in which the display device DD is installed in the electronic device ED (refer to FIG. 1A). The schematic cross-sectional view of FIG. 5A may include a cross-section taken along line II-II' of FIG. 4.

Referring to FIG. 5B, in case that the display device DD is installed in the electronic device ED (refer to FIG. 1A), the first panel area AA1 and the second panel area AA2 of the display panel DP may be disposed on planes different from each other. The second panel area AA2 may be disposed below the first panel area AA1.

Referring to FIGS. 5A and 5B, the window module WM may include a window UTG, a protection film PF disposed on the window UTG, a first adhesive layer AL1 for coupling or connecting the window UTG and the protection film PF, and a bezel pattern BP.

The bezel pattern BP overlaps the non-display area NDA in FIG. 1A. The bezel pattern BP may be disposed on one surface or a surface of the window UTG or one surface or a surface of the protection film PF. In FIG. 5A, the bezel pattern BP is disposed on a bottom surface of the protection film PF as an example. However, an embodiment is not limited thereto. For example, the bezel pattern BP may be disposed on a top surface of the protection film PF. The bezel pattern BP may be a colored light shielding layer provided by, for example, a coating method. The bezel pattern BP may include a base material and a dye or a pigment mixed with the base material. The bezel pattern BP may have a closed line shape or a substantially closed line shape on a plane.

The window UTG may be chemically reinforced glass. As the window UTG is applied to the display device DD, generation of wrinkles may be minimized although folding and unfolding are repeated.

The window UTG may include a top surface UTUS and a bottom surface UTBS. The top surface UTUS and the bottom surface UTBS may face each other. The bottom surface UTBS of the window UTG may be arranged or disposed between the top surface UTUS of the window UTG and the display panel DP. A slimming process may be performed on a portion of the window UTG, which overlaps the folding area FA0. The top surface UTUS of the window UTG may be an etched surface that has undergone the slimming process. Thus, a portion of the top surface UTUS of the window UTG may be a recessed shape or a substantially recessed shape. The slimmed portion of the window UTG may have a thickness less than that of a portion that may not be slimmed. Thus, the window UTG that has undergone the slimming process may be easily folded.

The protection film PF may include polyimide, polycarbonate, polyamide, triacetylcellulose, polymethylmethacrylate, or polyethylene terephthalate. Although not separately shown, at least one of a hard coating layer, an anti-finger-print layer, and an anti-reflection layer may be disposed on the top surface of the protection film PF.

The first adhesive layer AL1 may be a pressure sensitive adhesive film (PSA) or an optically clear adhesive (OCA). Adhesive layers to be described below may be the same as the first adhesive layer AL1 and include an adhesive. The first adhesive layer AL1 may have a shape substantially corresponding to that of the window UTG that has undergone the slimming process. The entire one surface or a surface of the window UTG may be attached to the first adhesive layer AL1.

The first adhesive layer AL1 may have a thickness enough to cover or overlap the bezel pattern BP. For example, the bezel pattern BP may have a thickness in a range of about 3 μm to about 8 μm, and the first adhesive layer AL1 may have a thickness enough to prevent bubbles generated around the bezel pattern BP. For example, the first adhesive layer AL1 may have a thickness in a range of about 20 μm to about 50 μm, for example, about 35 μm.

The first adhesive layer AL1 may be separated from the window UTG. Since the protection film PF has a strength less than that of the window UTG, scratches may be easily generated in the protection film PF. The first adhesive layer AL1 and the protection film PF may be separated, and the new protection film PF may be attached to the window UTG.

On a plane, an edge U-E of the window UTG may not overlap the bezel pattern BP. As the above-described condition is satisfied, the edge U-E of the window UTG may be exposed from the bezel pattern BP, and a micro-crack generated at the edge U-E of the window UTG may be inspected through an inspection device. The inspection device may include a microscope. A crack initiated from the edge U-E of the window UTG may be checked by photographing the edge U-E of the window UTG from above the top surface of the protection film PF using the inspection device.

On the plane, an edge P-E of the protection film PF and an edge A-E1 of the first adhesive layer AL1 may be aligned to each other. The protection film PF and the first adhesive layer AL1 may have the same surface area and the same shape or substantially the same surface area or shape as each other.

The window module WM and the display module DM may be coupled or connected by a second adhesive layer AL2. The second adhesive layer AL2 may include a pressure sensitive adhesive or a transparent adhesive such as an optically clear adhesive.

On the plane, an edge A-E2 of the second adhesive layer AL2 may overlap the window module WM. For example, the edge A-E2 of the second adhesive layer AL2 may overlap the window UTG. In a process of attaching the window module WM and the display module DM, a pressure may be applied to the second adhesive layer AL2. The second adhesive layer AL2 may receive a pressure and be stretched in a direction parallel to the first direction DR1 and the second direction DR2. Here, the second adhesive layer AL2 may have a surface area less than that of the window UTG so as not to protrude further than the window UTG.

In case that the first adhesive layer AL1 and the second adhesive layer AL2 are attached, during a folding operation of the electronic device ED (refer to FIG. 1A), a buckling phenomenon or a crack may be generated in the window UTG because the window UTG is not slipped. However, according to an embodiment, since the second adhesive layer AL2 has the surface area less than that of the window UTG, the first adhesive layer AL1 and the second adhesive layer AL2 may not be attached to each other, and a probability of foreign substances attached to the second adhesive layer AL2 may decrease.

The display module DM may include an optical film LF, a display panel DP, a panel protection layer PPL, a barrier layer BRL, a support layer PLT, a cover layer SCV, a heat dissipation layer RHL, a cushion layer CUL, an insulation layer INL, a spacer SPC, a step compensation pattern CP, and third to eleventh adhesive layers AL3 to AL11. The third to eleventh adhesive layers AL3 to AL11 may include a pressure sensitive adhesive or a transparent adhesive such as an optically clear adhesive. In an embodiment, some of the above-described components may be omitted, or other components may be further added. Also, the laminated order illustrated in FIG. 5A is merely an example, and the laminated order of the components may be changed.

The optical film LF is disposed in the first panel area AA1. The optical film LF covers or overlaps at least the display area DP-DA (refer to FIG. 2). The second adhesive layer AL2 may be coupled or connected to the optical film LF and the window module WM, and the third adhesive layer AL3 may be coupled or connected to the optical film LF and the display panel DP.

The panel protection layer PPL may be disposed below the display panel DP. The panel protection layer PPL may protect a lower portion of the display panel DP. The panel protection layer PPL may include a flexible plastic material. The panel protection layer PPL may prevent scratches from being generated on a rear surface of the display panel DP during a process of manufacturing the display panel DP. The panel protection layer PPL may be a colored polyimide film. For example, the panel protection layer PPL may be an opaque yellow film. However, an embodiment is not limited thereto.

In an embodiment, the panel protection layer PPL may not be disposed in the bending area BA. The panel protection layer PPL may include a first panel protection layer PPL-1 protecting the first panel area AA1 of the display panel DP and a second panel protection layer PPL-2 protecting the second panel area AA2. In case that the bending area BA is bent, the second panel protection layer PPL-2 may be disposed below the first panel protection layer PPL-1 and the first panel area AA1 together with the second panel area AA2 of the display panel DP. Since the panel protection layer PPL is not disposed in the bending area BA, the bending area BA may be further easily bent.

The fourth adhesive layer AL4 may couple or connect the panel protection layer PPL with the display panel DP. The fourth adhesive layer AL4 may include a first portion AL4-1 corresponding to the first panel protection layer PPL-1 and a second portion AL4-2 corresponding to the second panel protection layer PPL-2. The first portion AL4-1 may couple or connect the first panel protection layer PPL-1 to the first panel area AA1 of the display panel DP, and the second portion AL4-2 may couple or connect the second panel protection layer PPL-2 to the second panel area AA2 of the display panel DP.

The barrier layer BRL may be disposed below the panel protection layer PPL. The fifth adhesive layer AL5 may be disposed between the panel protection layer PPL and the barrier layer BRL and couple or connect the barrier layer BRL to the panel protection layer PPL. The fifth adhesive layer AL5 may be attached to a top surface of the barrier layer BRL. Thus, the fifth adhesive layer AL5 may be referred to as an upper adhesive layer.

The barrier layer BRL may increase a resistance against a compression force caused by external pressing. Thus, the barrier layer BRL may prevent the display panel DP from being deformed. The barrier layer BRL may include a flexible plastic material such as polyimide or polyethylene terephthalate.

Also, the barrier layer BRL may absorb light incident from the outside. The barrier layer BRL may include a light shielding material or be a colored film having a low light transmittance. For example, the barrier layer BRL may be a black plastic film, for example, a black polyimide film. In case that the display module DM is viewed from above the window module WM, components disposed below the barrier layer BRL may not be seen by a user.

The support layer PLT is disposed below the barrier layer BRL. The support layer PLT supports components disposed thereabove and maintains a folded state and an unfolded state of the display device DD. The support layer PLT may include a material having an elastic modulus of about 60 GPa or more. The support layer PLT may include a metal material such as stainless steel. Although the support layer PLT may include SUS 304 as an example, an embodiment is not limited thereto. For example, the support layer PLT may include various metal materials. The support layer PLT may support the display panel DP. Also, the support layer PLT may improve a heat dissipation performance of the display device DD.

Openings OP may be defined in a partial area of the support layer PLT corresponding to the folding area FA0. The support layer PLT may have improved flexibility by the openings OP.

In an embodiment, the support layer PLT may include a first support portion corresponding to the first non-folding area NFA10 and having an insulation property and a second support portion corresponding to the second non-folding area NFA20 and having an insulation property. The first support portion and the second support portion may be spaced apart from each other in the second direction DR2. The support layer PLT may correspond to the folding area FA0 to be disposed between the first support portion and the second support portion, and further include a folding area in which openings OP may be defined.

Each of the first support portion and the second support portion may include a nonmetallic material, plastic, glass fiber reinforced plastic, or glass. The plastic may include polyimide, polyethylene, or polyethylene terephthalate. However, an embodiment is not limited thereto. The first support portion and the second support portion may include the same material or similar material. The folding portion may include the same material or similar material as or a different material from the first support portion and the second support portion. For example, the folding portion may include a material having an elastic modulus of about 60 GPa or more or a metal material such as stainless steel. Although the folding portion may include SUS 304 as an example, an embodiment is not limited thereto. For example, the folding portion may include various metal materials.

The barrier layer BRL may have a surface area less than that of the support layer PLT. The surface areas may be surface areas on the plane. On the plane, the barrier layer BRL may overlap a portion of the support layer PLT. Another portion of the support layer PLT may not overlap the barrier layer BRL.

The sixth adhesive layer AL6 may be disposed between the barrier layer BRL and the support layer PLT. The sixth adhesive layer AL6 may couple or connect the barrier layer BRL and the support layer PLT to each other.

The sixth adhesive layer AL6 may include a first portion AL6-1 and a second portion AL6-2.

The first portion AL6-1 and the second portion AL6-2 may be spaced apart from each other with the openings OP therebetween. On the plane, the sixth adhesive layer AL6 may not overlap the openings OP. Also, on the plane, the sixth adhesive layer AL6 may be spaced apart from the openings OP.

The first portion AL6-1 may overlap the first non-folding area NFA10, the second portion AL6-2 may overlap the second non-folding area NFA20, and each of the first portion AL6-1 and the second portion AL6-2 may not overlap the folding area FA0. As the sixth adhesive layer AL6 is not disposed on an area corresponding to the folding area FA0, the support layer PLT may have improved flexibility.

In the area overlapping the folding area FA0, the barrier layer BRL may be spaced apart from the support layer PLT. An empty space ES may be defined between the support layer PLT and the barrier layer BRL in the area overlapping the folding area FA0. Air may be disposed in the empty space ES.

Since the empty space ES is defined between the support layer PLT and the barrier layer BRL in case that the electronic device ED (refer to FIG. 1A) is folded, a shape of the openings OP defined in the support layer PLT may not be seen from the outside of the electronic device ED (refer to FIG. 1A).

Also, as the barrier layer BRL include a light shielding material, or a colored film having a low light transmittance is applied as the barrier layer BRL, a color difference of the support layer PLT may not be seen from the outside. For example, a color difference between a first support area in which the openings OP may be defined and a second support area in which the openings OP may not be defined may not be seen from the outside. The first support area may overlap the folding area FA0, and the second support area may overlap the first non-folding area NFA10 and the second non-folding area NFA20.

The sixth adhesive layer AL6 may have a thickness less than that of the fifth adhesive layer AL6. For example, the fifth adhesive layer AL5 may have a thickness of about 25 μm, and the sixth adhesive layer AL6 may have a thickness of about 16 μm.

As the thickness of the sixth adhesive layer AL6 decreases, a stepped portion caused by the sixth adhesive layer AL6 may decrease. Although shape deformation of the laminated structures caused by folding and unfolding of the electronic device ED (refer to FIG. 1A) is reduced as the stepped portion decreases, the openings OP may be seen, or the sixth adhesive layer AL6 may be delaminated by the repeated folding operation. Although the openings OP may not be seen as the thickness of the sixth adhesive layer AL6 increases, and reliability on an adhesive force of the sixth adhesive layer AL6 with respect to the repeated folding operation may increase, the stepped portion may increase. Thus, the thickness of the sixth adhesive layer AL6 may be selected within an appropriate range in consideration of folding reliability, adhesion reliability, and possibility of seeing of the openings OP.

The seventh adhesive layer AL7 may be disposed below the support layer PLT, and the cover layer SCV may be disposed below the seventh adhesive layer AL7. The support layer PLT and the cover layer SCV may be coupled or connected by the seventh adhesive layer AL7. The cover layer SCV may be manufactured into a sheet shape or a substantially sheet shape and attached to the support layer PLT.

The seventh adhesive layer AL7 and the cover layer SCV may cover or overlap the openings OP defined in the support layer PLT. Thus, the cover layer SCV may prevent foreign substances from being introduced to the openings OP. The cover layer SCV may have an elastic modulus less than that of the support layer PLT. For example, the cover layer SCV may include a thermoplastic polyurethane, rubber, and silicon. However, an embodiment is not limited thereto.

The eighth adhesive layer AL8 may be disposed below the cover layer SCV. The eighth adhesive layer AL8 may include a first portion AL8-1 and a second portion AL8-2. The first portion AL8-1 and the second portion AL8-2 may be spaced apart from each other. On the plane, the first portion AL8-1 and the second portion AL8-2 may be spaced apart from each other with the openings OP therebetween.

The first portion AL8-1 and the second portion AL8-2 may not overlap each other in the folding area FA0.

The heat dissipation layer RHL may be disposed below the eighth adhesive layer AL8. The heat dissipation layer RHL may be a sheet having high thermal conductivity. The heat dissipation layer RHL may include metal or metal alloy, for example, copper, copper alloy, or graphite.

The heat dissipation layer RHL may include a first heat dissipation layer RHL-1 and a second heat dissipation layer RHL-2. The first heat dissipation layer RHL-1 and the second heat dissipation layer RHL-2 may be spaced a gap GP from each other. The gap GP may be in a range of about 0.4 mm to about 2.4 mm. However, an embodiment is not limited thereto. The gap GP may be disposed in correspondence to the folding area FA0.

The first heat dissipation layer RHL-1 may be coupled or connected to the cover layer SCV through the first portion AL8-1, and the second heat dissipation layer RHL-2 may be coupled or connected to the cover layer SCV through the second portion AL8-2. On the plane, the first heat dissipation layer RHL-1 may overlap the first non-folding area NFA10 and a portion of the folding area FA0, and the second heat dissipation layer RHL-2 may overlap the second non-folding area NFA20 and another portion of the folding area FA0.

On the plane, one portion or a portion of the first heat dissipation layer RHL-1 may overlap one portion or a portion of the openings OP, and one portion or a portion of the second heat dissipation layer RHL-2 may overlap another portion of the openings OP. The first heat dissipation layer RHL-1 and the second heat dissipation layer RHL-2 may serve to support the support layer PLT. For example, the area, in which the openings OP may be defined, of the support layer PLT may be supported by the first heat dissipation layer RHL-1 and the second heat dissipation layer RHL-2. Thus, the first heat dissipation layer RHL-1 and the second heat dissipation layer RHL-2 may be referred to as a first lower support layer and a second lower support layer, respectively.

The ninth adhesive layer AL9 may be disposed below the heat dissipation layer RHL. The ninth adhesive layer AL9 may include a first portion AL9-1 corresponding to the first heat dissipation layer RHL-1 and a second portion AL9-2 corresponding to the second heat dissipation layer RHL-2. The first portion AL9-1 and the second portion AL9-2 may be spaced the gap GP from each other.

The cushion layer CUL may be disposed below the ninth adhesive layer AL9. The cushion layer CUL may protect the display panel DP by absorbing an external impact. The cushion layer CUL may have an elastic modulus less than that of the support layer PLT. The cushion layer CUL may include a foam sheet having an elastic force. The cushion layer CUL may include a sponge or polyurethane.

The cushion layer CUL may include a first cushion layer CUL-1 corresponding to the first portion AL9-1 and a second cushion layer CUL-2 corresponding to the second portion AL9-2. The first cushion layer CUL-1 and the second cushion layer CUL-2 may be spaced the gap GP from each other. On the plane, the gap GP between the first cushion layer CUL-1 and the second cushion layer CUL-2 may overlap the folding area FA0. On the plane, the first cushion layer CUL-1 may overlap the first non-folding area NFA10 and a portion of the folding area FA0, and the second cushion layer CUL-2 may overlap the second non-folding area NFA20 and another portion of the folding area FA0.

The insulation layer INL may be disposed below the cushion layer CUL. In FIG. 5A, an embodiment in which an insulating tape is disposed is illustrated. The insulation layer INL may prevent static electricity from being introduced. Although not shown in FIG. 5A, the flexible circuit film FCB may be disposed on the insulation layer INL. The insulation layer INL may prevent the flexible circuit film FCB from being electrically interfered with members disposed on the insulation layer INL.

One surface or a surface of the step compensation pattern CP may be coupled or connected to the support layer PLT through the tenth adhesive layer AL10. The eleventh adhesive layer AL11 may be disposed on the other surface of the step compensation pattern CP. The eleventh adhesive layer AL11 may be used in case that the display device DD (refer to FIG. 2) is coupled or connected with another component of the electronic device ED (refer to FIG. 2).

Referring to FIG. 5B, the bending area BA may be bent so that the second panel area AA2 is disposed below the first panel area AA1. Thus, the driving chip DIC (refer to FIG. 5A) may be disposed below the first panel area AA1. The first panel area AA1 and the second panel area AA2 may be disposed on different planes (or reference surfaces) from each other.

The bending protection layer BPL is disposed in at least the bending area BA. The bending protection layer BPL may overlap the bending area BA, the first panel area AA1, and the second panel area AA2. The bending protection layer BPL may be disposed on one portion or a portion of the first panel area AA1 and one portion or a portion of the second panel area AA2 in addition to the bending area BA.

The bending protection layer BPL may be bent together with the bending area BA. The bending protection layer BPL protects the bending area BA from an external impact and controls a neutral surface of the bending area BA. The bending protection layer BPL controls a stress of the bending area BA so that the neutral surface becomes adjacent to signal lines disposed in the bending area BA.

One surface or a surface of the second panel protection layer PPL-2, to which the second portion AL4-2 of the fourth adhesive layer AL4 is not attached, is attached to the spacer SPC. Although the single-layered spacer SPC is illustrated in FIGS. 5A and 5B, the spacer SPC may have a multi-layered structure in which a baser layer is disposed between two adhesive layers. The base layer may include graphite having an excellent heat dissipation property.

Figure 6A:
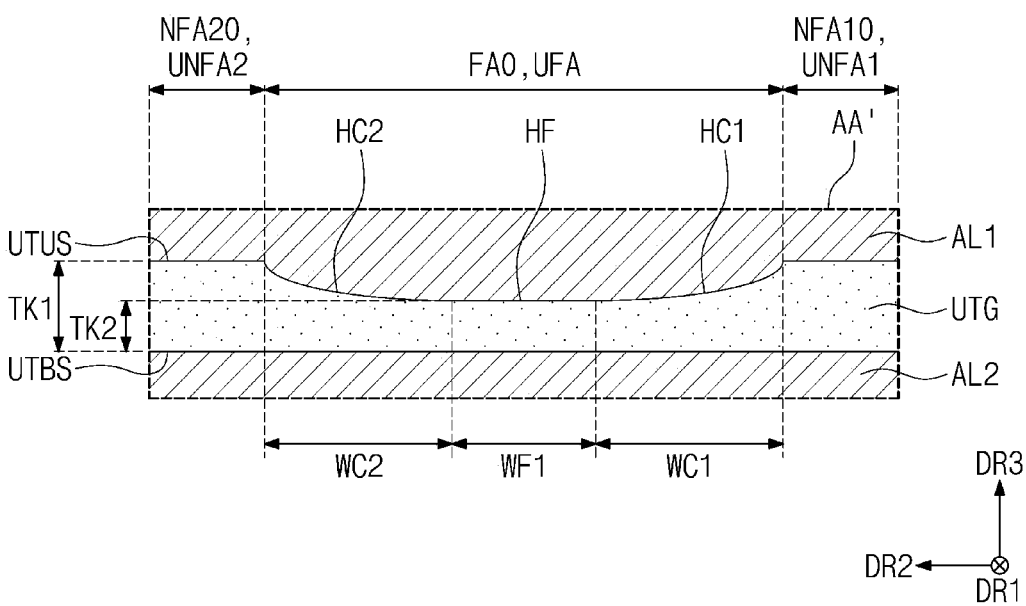
FIG. 6A is an enlarged schematic cross-sectional view illustrating area AA' of FIG. 5A.
Figure 6B:
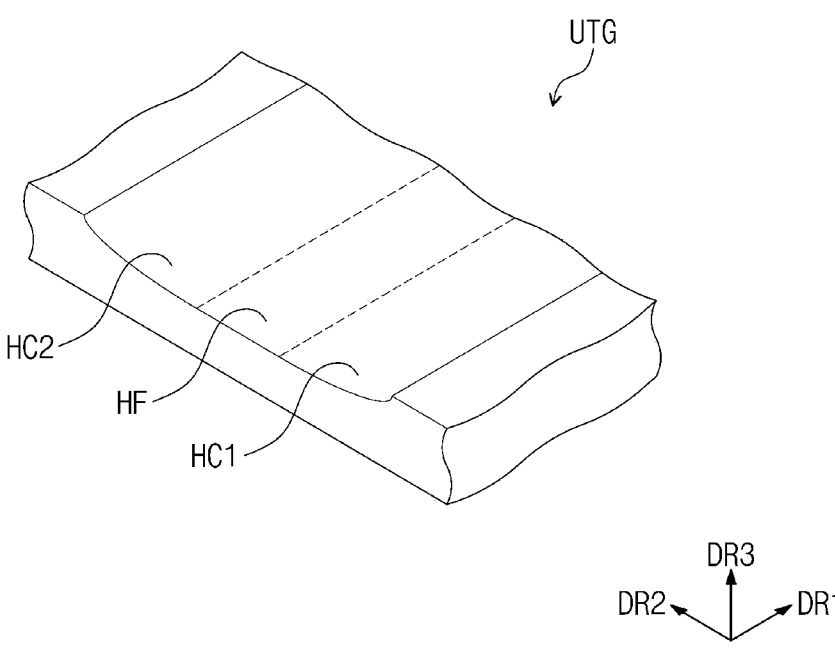
FIG. 6B is a schematic perspective view illustrating a portion of a window according to an embodiment.

FIG. 6A is an enlarged schematic cross-sectional view illustrating area AA' of FIG. 5A. FIG. 6B is a schematic perspective view illustrating a portion of the window according to an embodiment.

Referring to FIGS. 5A, 6A, and 6B, the window UTG may include a folding portion UFA, a first non-folding portion UNFA1, and a second non-folding portion UNFA2. The folding portion UFA may overlap the folding area FA0 of the display panel DP, the first non-folding portion UNFA1 may overlap the first non-folding area NFA10 of the display panel DP, and the second non-folding portion UNFA2 may overlap the second non-folding area NFA20 of the display panel DP.

Although the folding portion UFA of the window UTG has the same width as the folding area FA0 of the display panel DP in FIG. 6A as an example, an embodiment is not limited thereto. For example, the folding portion UFA of the window UTG may have a width greater or less than that of the folding area FA0 of the display panel DP as long as the folding portion UFA of the window UTG overlaps the folding area FA0 of the display panel DP.

Each of the first non-folding portion UNFA1 and the second non-folding portion UNFA2 may have a first thickness TK1 greater than a second thickness TK2 of the folding portion UFA. For example, the first thickness TK1 may be a maximum thickness or a mean thickness of each of the first non-folding portion UNFA1 and the second non-folding portion UNFA2, and the second thickness TK2 may be a minimum thickness of the folding portion UFA.

The first thickness TK1 may be in a range of about 50 $\mu$m to about 100 $\mu$m, for example, about 70$\mu$. The second thickness TK2 may be in a range of about 20 $\mu$m to about 60 $\mu$m, for example, about 30 $\mu$m.

Each of the first non-folding portion UNFA1 and the second non-folding portion UNFA2 may include one flat portion or a flat portion of the top surface UTUS and one flat portion or a flat portion of the bottom surface UTBS. Thus, each of the first non-folding portion UNFA1 and the second non-folding portion UNFA2 may have the maximum thickness that may be equal to the mean thickness of each of the first non-folding portion UNFA1 and the second non-folding portion UNFA2. The first non-folding portion UNFA1 and the second non-folding portion UNFA2 may be referred to as a first flat portion and a second flat portion, respectively.

One portion or a portion of the window UTG, which has undergone the slimming process, may correspond to the folding portion UFA. Thus, the folding portion UFA may have an non-uniform thickness. For example, the folding portion UFA may have a thickness that gradually decreases in a direction away from each of the first non-folding portion UNFA1 and the second non-folding portion UNFA2.

One portion or a portion of the top surface UTUS of the window UTG, which is contained in the folding portion UFA, may include a first curved surface HC1, a flat surface HF, and a second curved surface HC2. The first curved surface HC1, the flat surface HF, and the second curved surface HC2 may be referred to as a first inclined surface, a reference surface, and a second inclined surface, respectively. Also, the first curved surface HC1, the flat surface HF, and the second curved surface HC2 may be referred to as a first substantially curved surface, a substantially flat surface, and a second substantially curved surface, respectively. The first curved surface HC1, the flat surface HF, and the second curved surface HC2 may be sequentially defined in the second direction DR2. The second thickness TK2 of the folding portion UFA may be a thickness of the window UTG in which the flat surface HF is defined. The flat surface HF may overlap the folding axis FX (refer to FIG. 1B).

The first curved surface HC1 may be a surface extending from the first non-folding portion UNFA1 and having a curvature. The flat surface HF may extend from the first curved surface HC1 and be parallel to a plane defined by a first direction DR1 and a second direction DR2. The second curved surface HC2 may be a surface extending from the flat surface HF and having a curvature.

The flat surface HF may have a surface parallel to a top surface of the first non-folding portion UNFA1 and a top surface of the second non-folding portion UNFA2. As an area of the window UTG, which has undergone the slimming process, has the flat surface HF parallel to an area that has not undergone the slimming process, a probability of seeing the area that has undergone the slimming process may decrease. Also, since a thickness of the slimmed portion of the window UTG is gradually varied by the first curved surface HC1 and the second curved surface HC2, the probability of seeing the area that has undergone the slimming process from the outside may decrease.

Each of a first width WC1 of the first curved surface HC1, which is parallel to the second direction DR2, and a second width WC2 of the second curved surface HC2, which is parallel to the second direction DR2, may be greater than a third width WF1 of the flat surface HF, which is parallel to the second direction DR2. For example, each of the first width WC1 and the second width WC2 may be equal to or greater than two times of the second width WF1, for example, equal to or greater than three times of the second width WF1.

Each of the first width WC1 and the second width WC2 may be about 26 mm or more, for example, about 26 mm. The third width WF1 may be about 8 mm or more, for example, about 8 mm.

As a sum of the first to third widths WC1, WC2, and WF1 increases, the first thickness TK1 increases, and a difference between the first thickness TK1 and the second thickness TK2 decreases, a possibility of seeing a shape of the folding portion UFA from the outside may decrease. Each of numeric values of slimmed portions may be determined in consideration of folding reliability of the window UTG and whether the slimmed portion is seen from the outside.

Figure 7A:
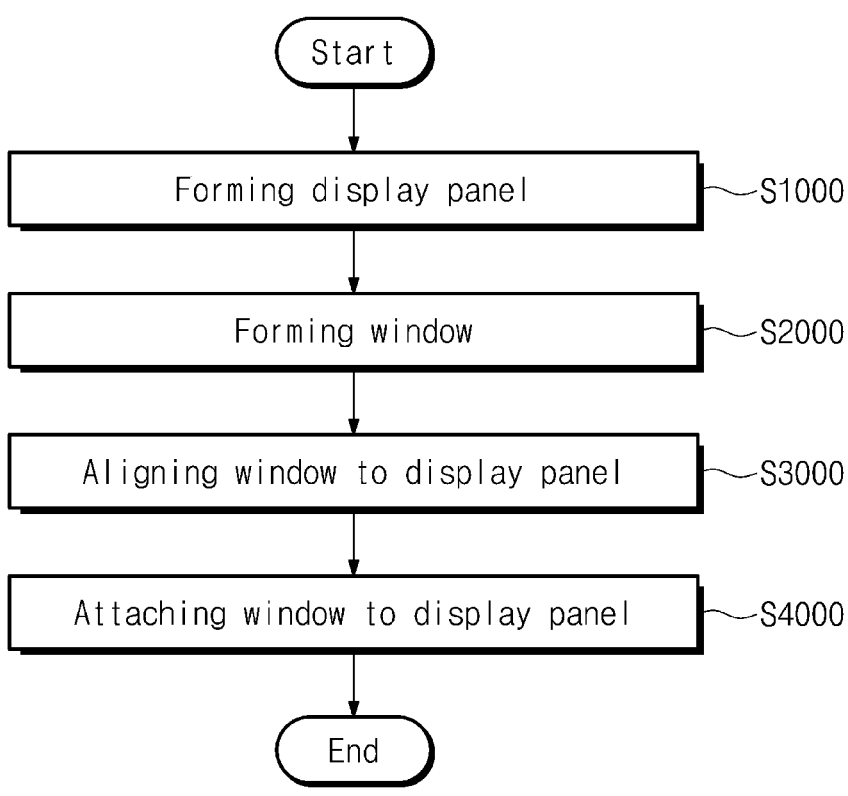
FIG. 7A is a flowchart representing a method of manufacturing a display device according to an embodiment.

FIG. 7A is a flowchart representing a method of manufacturing a display device according to an embodiment.

Referring to FIGS. 5A and 7A, a display panel DP is formed in a process S1000. The display panel DP may include an organic layer, an inorganic layer, a semiconductor pattern, a conductive pattern, and a signal line. The organic layer, the inorganic layer, the semiconductor layer, and the conductive layer may be formed on a base layer by a method such as coating and deposition. Thereafter, the organic layer, the inorganic layer, the semiconductor layer, and the conductive layer may be selectively patterned through photolithography processes to form a semiconductor pattern, a conductive pattern, and a signal line.

A window UTG is formed in a process S2000. The window UTG may be chemically reinforced glass that is partially slimming-processed. A method of manufacturing the window UTG will be described later.

The window UTG and the display panel DP are aligned in a process S3000. For example, the window UTG and the display panel DP are aligned so that a bottom surface UTBS of the window UTG is disposed between a top surface UTUS of the window UTG and the display panel DP. Thereafter, the bottom surface UTBS of the window UTG is attached to the display panel DP in a process S4000.

Figure 7B:
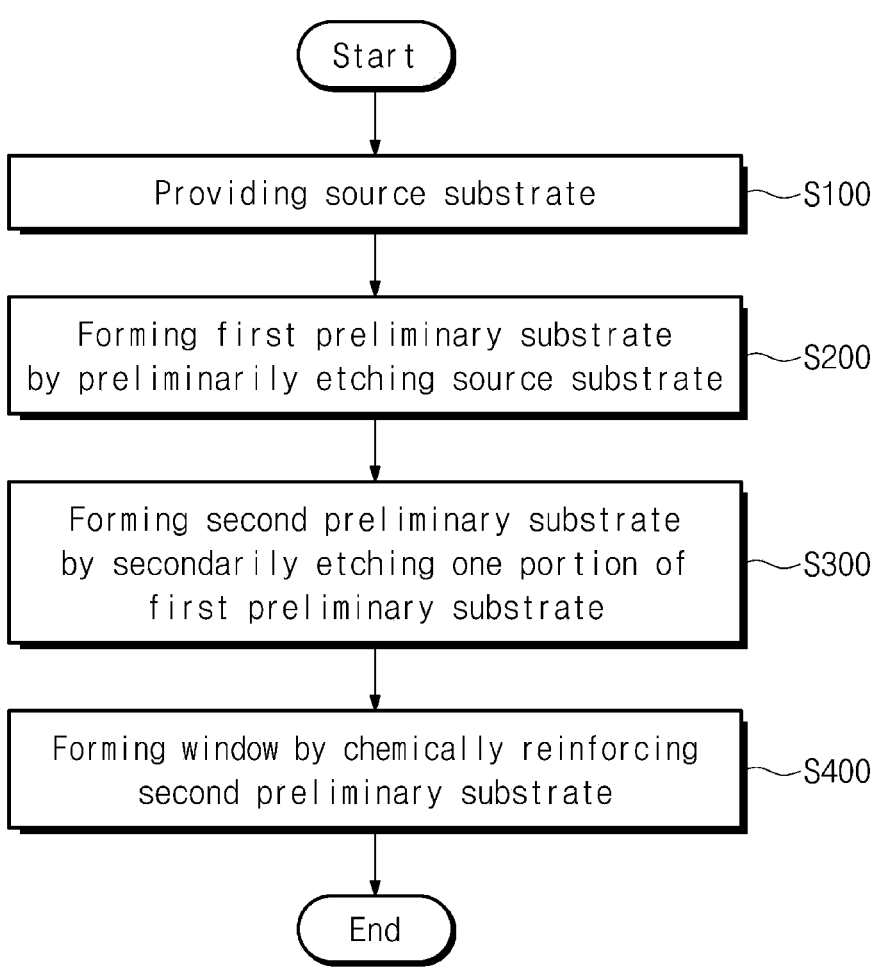
FIG. 7B is a flowchart representing a method of manufacturing a window according to an embodiment.
Figure 7C:
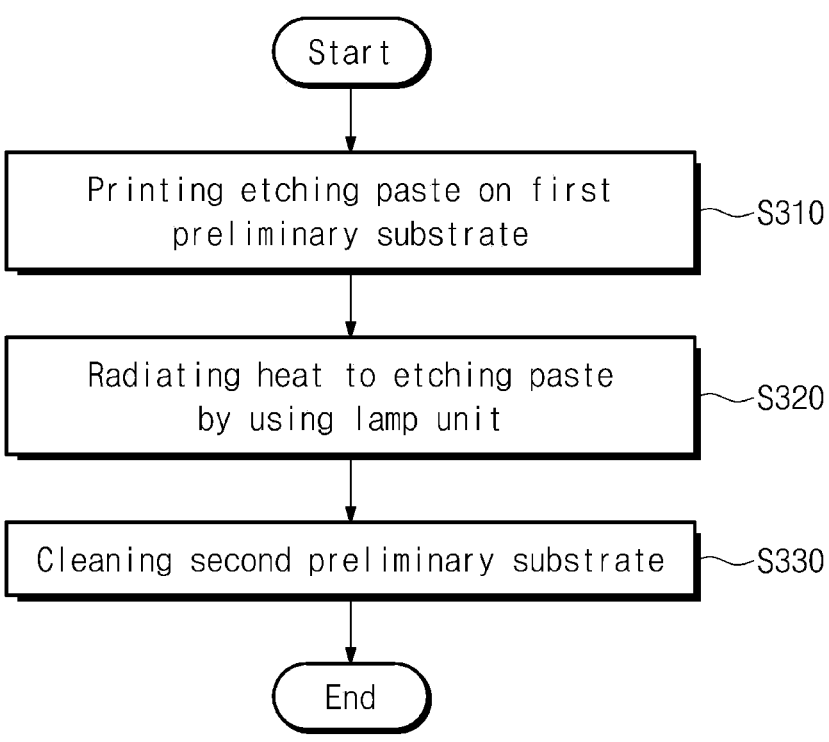
FIG. 7C is a flowchart representing a method of manufacturing a window according to an embodiment.
Figure 8A:
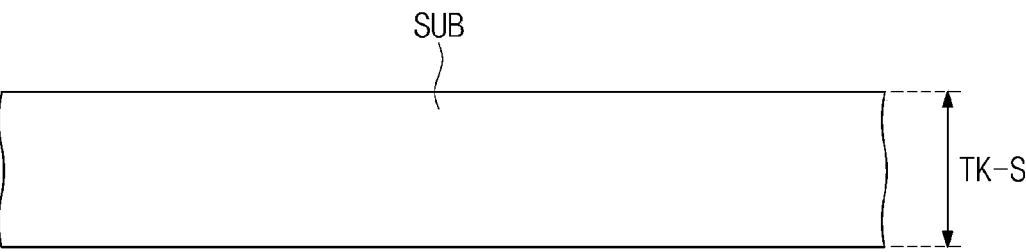
FIGS. 8A to 8E are views illustrating a partial process of the method of manufacturing the window according to an embodiment.
Figure 8B:
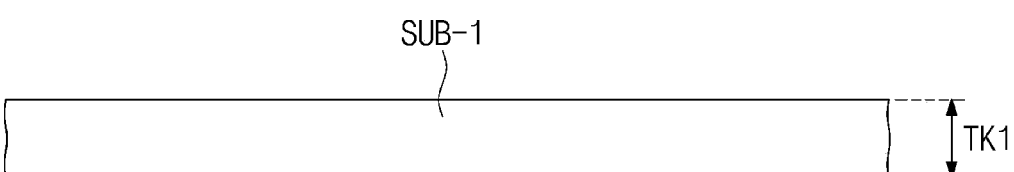
Figure 8C:
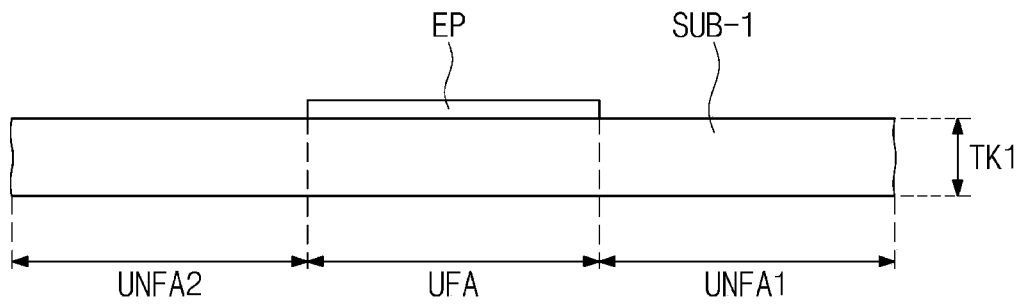
Figure 8D:
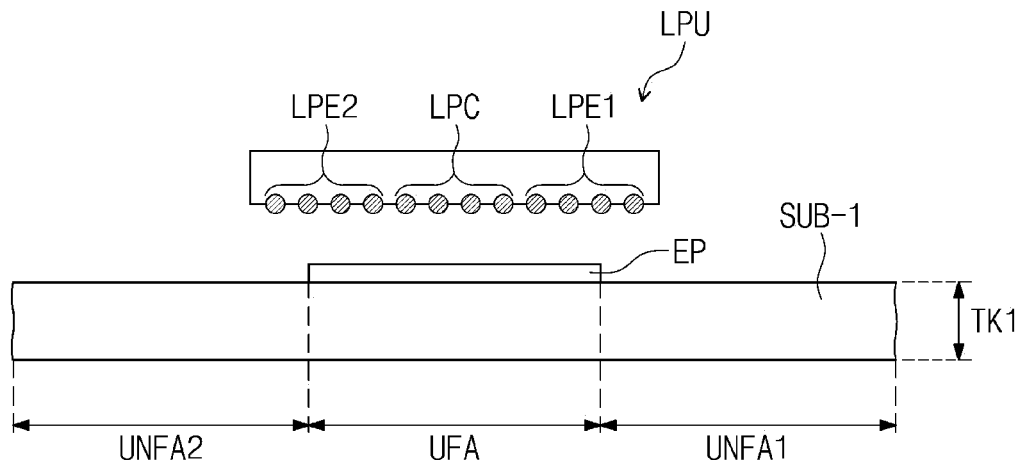
Figure 8E:
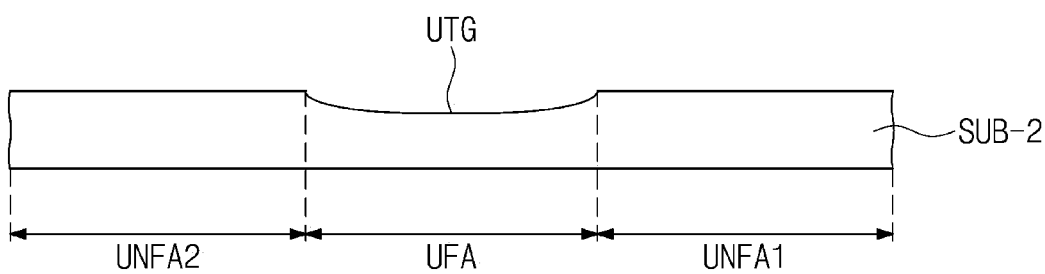
Figure 9:
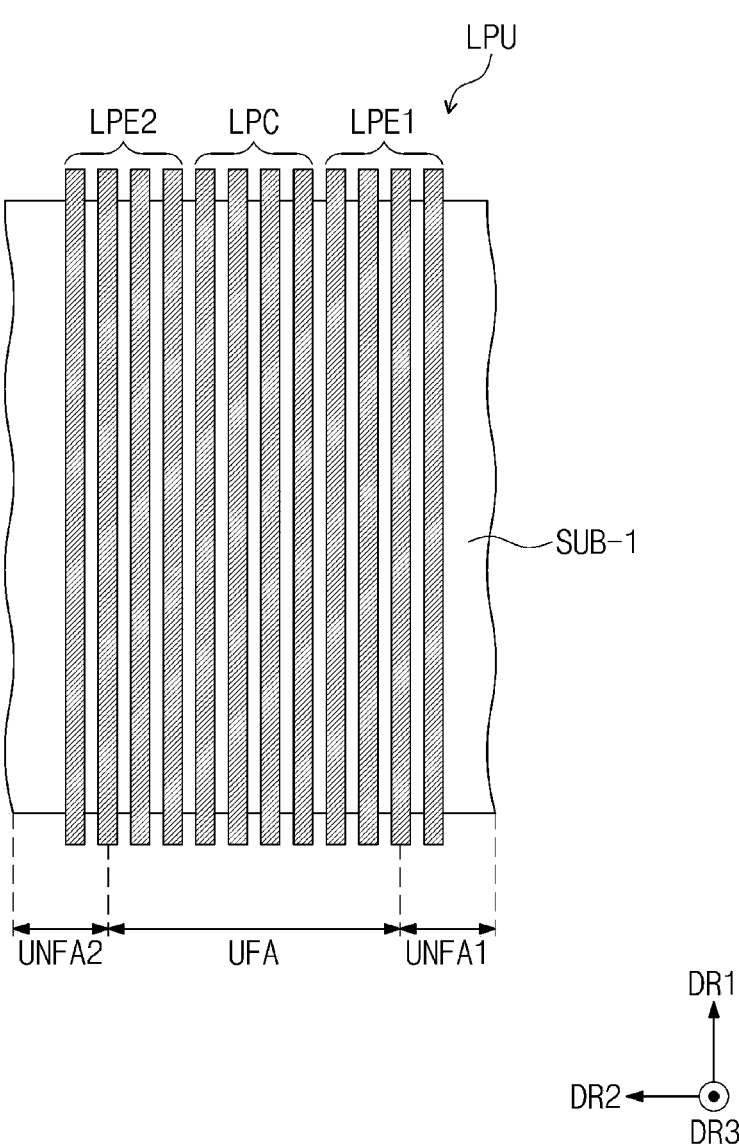
FIG. 9 is a plan view illustrating one process of the method of manufacturing the window according to an embodiment.

FIG. 7B is a flowchart representing a method for manufacturing a window according to an embodiment. FIG. 7C is a flowchart representing a method for manufacturing a window according to an embodiment. FIGS. 8A to 8E are views each illustrating a partial process of the method of manufacturing the window according to an embodiment. FIG. 9 is a plan view illustrating one process of the method of manufacturing the window according to an embodiment.

Referring to FIGS. 7B, 7C, and 8A to 8E, a source substrate SUB is provided in a process S100. The source substrate SUB may have a glass substrate. The source substrate SUB may be referred to as a base glass. The source substrate SUB may be flat. The source substrate SUB may have a size that is not matched with a size applied to a final product. The source substrate SUB may be cut into the size applied to the final product after the window manufacturing process. However, an embodiment is not limited thereto. For example, the source substrate SUB may be cut in correspondence to the size applied to the product.

As the source substrate SUB is preliminarily etched, a first preliminary substrate SUB-1 is formed in a process S200. For example, as the source substrate SUB is etched in a thickness direction thereof, the first preliminary substrate SUB-1 is formed. The first preliminary substrate SUB-1 may have a thickness TK1 less than a thickness TK-S of the source plate SUB.

As a portion of the first preliminary substrate SUB-1 is secondarily etched, a second preliminary substrate SUB-2 is formed in a process S300. An etching paste EP (or etching cream) is formed on one portion or a portion of the first preliminary substrate SUB-1 in a process S310. The etching paste EP is formed on the first preliminary substrate SUB-1 by screen printing. A material of the etching paste EP is not particularly limited as long as the material is able to etch the first preliminary substrate SUB-1. An area on which the etching paste EP is printed may correspond to the folding portion UFA, and an area on which the etching paste EP is not printed may correspond to the first or second non-folding portion UNFA1 or UNFA2.

In case that a portion of the first preliminary substrate SUB-1 is etched by using the etching paste EP, etching uniformity and thickness uniformity for each process may improve. For example, a spray method has various operation and design variables such as a position of a heating wire, a position of a nozzle, a distance between a nozzle and a target substrate, an injection angle, a chemical solution, a flow rate, and a concentration. However, in case of using the etching paste EP, since the etching paste EP is attached to an etching target area, a process may be simplified, and further exact etching may be performed in comparison with the spray method to improve a process capability.

Heat is radiated to the etching paste EP by a lamp or a lamp unit LPU in a process S320. One portion or a portion of the first preliminary substrate SUB-1, to which heat is radiated by the lamp unit LPU, may have a surface area greater than that of one portion or a portion of the first preliminary substrate SUB-1, on which the etching paste EP is formed. Referring to FIG. 9, the folding portion UFA, one portion of the first non-folding portion UNFA1, and one portion or a portion of the second non-folding portion UNFA2 may overlap the lamp unit LPU. The etching paste EP may be entirely covered or overlapped by the lamp unit LPU and receive sufficient heat from the lamp unit LPU.

The lamp unit LPU may include a first lamp LPE1, a second lamp LPC, and a third lamp LPE2. Each of the first to third lamps LPE1, LPC, and LPE2 may be an infrared lamp. Although each of the first lamp LPE1, the second lamp LPC, and the third lamp LPE2 is provided in plurality in FIG. 8D as an example, an embodiment is not limited thereto. For example, each of the first lamp LPE1, the second lamp LPC, and the third lamp LPE2 may be provided in singularity. As an example, the second lamp LPC may be provided in singularity, and each of the first lamp LPE1 and the third lamp LPE2 may be provided in plurality.

The first preliminary substrate SUB-1 may have an etching rate that is varied according to a temperature. Thus, the lamp corresponding to an area to be further etched may be set to have a highest temperature. Thus, the second lamp LPC may have a temperature greater than that of each of the first lamp LPE1 and the third lamp LPE2. The temperature may be selected in a range from about 40° to about 80°. However, an embodiment is not limited thereto.

Each of the first lamp LPE1 and the third lamp LPE2 may be provided in plurality, and each of the first lamps LPE1 and the third lamps LPE2 may have a temperature gradient that gradually lowers or decreases in a direction away from the second lamp LPC. Thus, the first curved surface HC1 and the second curved surface HC2 in FIG. 6A may be formed by the first lamps LPE1 and the third lamps LPE2, respectively.

The second lamp LPC may be provided in plurality, and the second lamps LPC may have the same temperature as each other. The flat surface HF in FIG. 6A may be formed by the second lamp LPC.

In case that the second preliminary substrate SUB-2 is formed, the second preliminary substrate SUB-2 is cleaned in a process S330. The etching paste and foreign substances remained on the second preliminary substrate SUB-2 may be removed. For example, the second preliminary substrate SUB-2 may be cleaned by alkali solution and deionized water (DIW).

Thereafter, as the second preliminary substrate SUB-2 is chemically reinforced, the window UTG (refer to FIG. 6A) is formed in a process S400. For example, the second preliminary substrate SUB-2 may be chemically reinforced so that the window UTG (refer to FIG. 6A) has improved impact resistance. For example, the second preliminary substrate SUB-2 may be submerged into strengthening molten salt to strengthen a surface of the second preliminary substrate SUB-2 by an ion exchange method, thereby forming the window UTG (refer to FIG. 6A).

According to an embodiment, a portion in a thickness direction of one portion or a portion of the window UTG (refer to FIG. 6A), which overlaps the folding area FA (refer to FIG. 1A), may be removed. This may be referred to as a slimming process. The window UTG (refer to FIG. 6A) that has undergone the slimming process may be easily folded and have improved folding reliability. Also, since only a thickness of an area of the window UTG (refer to FIG. 6A) is adjusted, another portion of the window UTG (refer to FIG. 6A) may have a relatively great thickness. Thus, reliability on an evaluation of the impact resistance of the window UTG (refer to FIG. 6A) may improve.

According to an embodiment, one portion or a portion of the window UTG (refer to FIG. 6A) may be etched by the etching paste EP and the lamp unit LPU having a temperature gradient. Since the etching paste EP may be attached to the etching target area and control the temperature of the lamp unit LPU to adjust the etching rate, the slimming process may be simplified, and further exact etching may be performed to improve a slimming process performance.

According to an embodiment, as the area of the window UTG (refer to FIG. 6A), which has undergone the slimming process, has the flat surface parallel to the area that has not undergone the slimming process, the probability of seeing the area that has undergone the slimming process may decrease.

As described above, the slimming process may be performed on one portion or a portion of the window. Thus, a portion of the one surface or a surface of the window may have a recessed shape or a substantially recessed shape. The slimmed portion of the window may have a thickness less than that of a portion that is not slimmed. Thus, the window that has undergone the slimming process may be easily folded. One portion or a portion of the window may be etched by the etching paste and the lamp unit having a temperature gradient. Since the etching paste may be attached to the etching target area and control the temperature of the lamp unit to adjust the etching rate, the slimming process may be simplified, and further exact etching may be performed to improve the slimming process performance.

The window may include the recessed folding portion including the first curved surface, the flat surface, and the second curved surface; the first non-folding portion; and the second non-folding portion. The folding portion corresponds to one portion or a portion of the window, which has undergone the slimming process. As the area of the window, which has undergone the slimming process, has the flat surface parallel to the area that has not undergone the slimming process, the probability of seeing the area that has undergone the slimming process may decrease.

Although embodiments have been described, it is understood that the disclosure should not be limited to these embodiments but various changes and modifications can be made by one of ordinary skill in the art within the spirit and scope of the disclosure as hereinafter claimed. Hence, the protective scope shall be determined by disclosure and the scope of the accompanying claims.

What is claimed is:

1. A display device comprising:
a display panel configured to display an image, the display panel including:
a first non-folding area;
a second non-folding area; and
a folding area disposed between the first non-folding area and the second non-folding area; and
a window disposed on the display panel and comprising a folding portion overlapping the folding area of the display panel, a first non-folding portion overlapping the first non-folding area of the display panel, and a second non-folding portion overlapping the second non-folding area of the display panel,
wherein the folding portion of the window comprises:
a first substantially curved surface, a substantially flat surface extending from the first substantially curved surface; and
a second substantially curved surface extending from the substantially flat surface,
wherein the substantially flat surface, an upper surface of the first non-folding portion, and an upper surface of the second non-folding portion are parallel to a first direction and a second direction intersecting the first direction,
wherein the first substantially curved surface, the substantially flat surface, and the second substantially curved surface are in sequence in the second direction,
wherein each of a first width of the first substantially curved surface, parallel to the second direction, and a second width of the second substantially curved surface, parallel to the second direction, is greater than a third width of the substantially flat surface, parallel to the second direction, and
wherein the third width of the substantially flat surface is equal to or greater than 8 millimeters and is not greater than half of the first width.

2. The display device of claim 1, wherein each of the folding area of the display panel and the folding portion of the window is folded and unfolded with respect to a folding axis extending in the first direction.

3. The display device of claim 2, wherein each of the first width of the first substantially curved surface and the second width of the second substantially curved surface is about 26 mm.

4. The display device of claim 1, wherein each of a thickness of the first non-folding portion and a thickness of the second non-folding portion is greater than a minimum thickness of the folding portion of the window.

5. The display device of claim 1, wherein
the window includes a top surface and a bottom surface facing the top surface,
the bottom surface of the window is disposed between the top surface of the window and the display panel, and
the top surface comprises the first substantially curved surface, the substantially flat surface, and the second substantially curved surface.

6. The display device of claim 1, further comprising:
a protection film disposed on the window; and
a first adhesive layer disposed between the protection film and the window,
wherein the first adhesive layer is disposed on the first substantially curved surface, the substantially flat surface, and the second substantially curved surface.

7. The display device of claim 1, wherein the window is a glass substrate.

8. The display device of claim 6, wherein a width of the window in the second direction is less than a width of the first adhesive layer.

9. The display device of claim 8, further comprising:
a second adhesive layer between the window and the display panel,
wherein a width of the second adhesive layer in the second direction is less than the width of the window.

10. An electronic device comprising:
a display device; and
a main controller configured to control the display device,
wherein the display device comprises:
a display panel configured to display an image, the display panel including:
a first non-folding area;
a second non-folding area; and
a folding area disposed between the first non-folding area and the second non-folding area; and
a window disposed on the display panel and comprising a folding portion overlapping the folding area of the display panel, a first non-folding portion overlapping the first non-folding area of the display panel, and a second non-folding portion overlapping the second non-folding area of the display panel,
wherein the folding portion of the window comprises:
a first substantially curved surface, a substantially flat surface extending from the first substantially curved surface; and
a second substantially curved surface extending from the substantially flat surface,
wherein the substantially flat surface, an upper surface of the first non-folding portion, and an upper surface of the second non-folding portion are parallel to a first direction and a second direction intersecting the first direction,
wherein the first substantially curved surface, the substantially flat surface, and the second substantially curved surface are in sequence in the second direction,
wherein each of a first width of the first substantially curved surface, parallel to the second direction, and a second width of the second substantially curved surface, parallel to the second direction, is greater than a third width of the substantially flat surface, parallel to the second direction, and
wherein the third width of the substantially flat surface is equal to or greater than 8 millimeters and is not greater than half of the first width.

* * * * *